(12) United States Patent
Brinks et al.

(10) Patent No.: US 11,917,274 B2
(45) Date of Patent: Feb. 27, 2024

(54) METHOD FOR MANUFACTURING A CAMERA MODULE, CAMERA MODULE

(71) Applicant: Robert Bosch GmbH, Stuttgart (DE)

(72) Inventors: Gerald Brinks, Waltenhofen (DE); Guenter Escher, Oberstdorf (DE); Matthias Pohl, Immenstadt (DE); Peter Diesel, Bad Hindelang (DE)

(73) Assignee: ROBERT BOSCH GMBH, Stuttgart (DE)

( * ) Notice: Subject to any disclaimer, the term of this patent is extended or adjusted under 35 U.S.C. 154(b) by 214 days.

(21) Appl. No.: 17/389,965

(22) Filed: Jul. 30, 2021

(65) Prior Publication Data

US 2022/0046147 A1 Feb. 10, 2022

(30) Foreign Application Priority Data

Aug. 5, 2020 (DE) .......................... 102020209839.5

(51) Int. Cl.
*H04N 23/51* (2023.01)
*H05K 3/30* (2006.01)
*G02B 7/02* (2021.01)
*H04N 23/55* (2023.01)
*H04N 23/57* (2023.01)

(52) U.S. Cl.
CPC ............. *H04N 23/51* (2023.01); *G02B 7/022* (2013.01); *H04N 23/55* (2023.01); *H04N 23/57* (2023.01); *H05K 3/30* (2013.01)

(58) Field of Classification Search
CPC ........... B60R 16/03; B60S 1/026; G02B 7/02; G02B 7/028; G02B 27/0006; G02B 7/022; G03B 17/12; G03B 17/55; H05K 1/0201; H05K 1/18; H05K 3/30; H04N 23/51; H04N 23/52; H04N 23/54; H04N 23/55; H04N 23/57
See application file for complete search history.

(56) References Cited

U.S. PATENT DOCUMENTS

2018/0345911 A1* 12/2018 Zurowski ............... G03B 17/55

* cited by examiner

*Primary Examiner* — Antoinette T Spinks
(74) *Attorney, Agent, or Firm* — NORTON ROSE FULBRIGHT US LLP

(57) ABSTRACT

A method for manufacturing a camera module. The method includes: a) mounting an image sensor on a circuit board, b) inserting and fixing the circuit board into a housing, c) aligning an objective lens accommodated in the housing and including an electrical interface with respect to the image sensor, d) fixing the objective lens in the housing. In step b) spring contacts, which are movable with respect to the circuit board, are inserted into the housing together with the circuit board and, in a step e), i.e., after the fixation of the objective lens in the housing, are brought into contact with the electrical interface with the aid of clamping and/or fixing elements.

9 Claims, 3 Drawing Sheets

METHOD FOR MANUFACTURING A CAMERA MODULE, CAMERA MODULE

CROSS REFERENCE

The present application claims the benefit under 35 U.S.C. § 119 of German Patent Application No. DE 102020209839.5 filed on Aug. 5, 2020, which is expressly incorporated herein by reference in its entirety.

FIELD

The present invention relates to a method for manufacturing a camera module. Moreover, a camera module is provided, which is manufacturable according to the method according to the present invention.

Camera modules of the aforementioned type are utilized in large numbers in the automotive sector, in particular for surroundings monitoring.

Alternative areas of application are mobile terminals from the consumer sector and/or professional and scientific applications.

BACKGROUND INFORMATION

Conventional camera modules including objective lenses are available into which at least one electrical consumer is integrated. This may be, for example, an autofocus device, an aperture adjuster, and/or a heating device. The heating device is to prevent a fogging up and/or icing up of an objective lens. Provided that an electrical consumer is integrated into the objective lens, it must be supplied with electrical energy. This may be implemented, for example, camera-internally via the camera's own electronics system.

In larger cameras including interchangeable objective lenses, the contacting may be implemented via a quick-change interface such as, for example, a bayonet joint. Cameras for the near-field monitoring of a vehicle, which are generally installed in the outer area, for example, at the side-view mirror, at the front grill, and/or at the tailgate, often do not include an electrical consumer due to their small overall size and their configuration. Provided that an electrical consumer is provided, it is generally electrically contacted with the aid of plug connectors. This type of contacting may hardly be implemented in an overall size-neutral manner, however, so that, in particularly small camera modules, the electrical connection is usually adapted and not integrated.

The difficulty of an integrated electrical connection of an electrical consumer integrated into the objective lens lies in the fact, in particular, that it must take place during the assembly of the camera module. This is the case because, after the assembly, the electrical interface is generally no longer accessible. In addition, the connection should take place as force-free as possible or at least using little force, in order not to adversely affect the focal position of the objective lens aligned with respect to an image sensor. The objective lens is, in fact, fixed after the alignment, for example, via an adhesive bond. The objective lens may change its position before the adhesive bond has completely cured, however.

An object of the present invention is to provide an electrical contacting of an electrical consumer integrated into an objective lens, which is as overall size-neutral as possible and as force-free as possible.

In order to achieve the object, the method having the features in accordance with an example embodiment of the present invention and the camera module having the features of an example embodiment of the present invention are provided. Advantageous refinements of the present invention are disclosed herein.

SUMMARY

In accordance with an example embodiment of the present invention, the method for manufacturing a camera module includes the following steps:
   a) mounting an image sensor on a circuit board,
   b) inserting and fixing the circuit board into a housing,
   c) aligning an objective lens accommodated in the housing and including an electrical interface with respect to the image sensor,
   d) fixing the objective lens in the housing.

According to an example embodiment of the present invention, in step b) spring contacts, which are movable with respect to the circuit board, are inserted into the housing together with the circuit board and, in a step e), i.e., after the fixation of the objective lens in the housing, are brought into contact with the electrical interface with the aid of clamping and/or fixing elements.

The electrical contacting therefore takes place only after the objective lens has been fixed in position. Provided that the fixation in position is implemented with the aid of an adhesive bond, this must cure before the spring contacts are brought into contact with the electrical interface. Since the spring forces of the spring contacts become effective only after the adhesive bond has reached its ultimate strength, the focal position of the objective lens is not adversely affected.

Due to the fact that the spring contacts are already inserted into the housing together with the circuit board, a camera-internal or camera-integrated electrical connection of the electrical consumer may be implemented. The spring contacts are still movably accommodated in the housing, however, after the insertion and fixation of the circuit board in the housing. This makes it possible to subsequently bring the spring contacts into contact with the electrical interface of the objective lens. The actual contacting is therefore first effectuated in step e) with the aid of the clamping and/or fixing elements. Preferably, the clamping and/or fixing elements are first inserted into the housing in step e). Moreover, preferably, when the clamping and/or fixing elements are inserted into the housing, the spring contacts are pressed against the electrical interface of the objective lens.

The method provided here may also have the advantage that the order of the individual assembly steps may be essentially retained during the manufacture of the camera module. In accordance with an example embodiment, step b) only needs to be adapted in such a way that the circuit board is inserted into the housing together with the spring contacts. Step e) is a new addition, since the electrical contacting takes place only after the assembly of the circuit board and the objective lens.

In the method provided here in accordance with an example embodiment of the present invention, preferably two spring contacts are situated at opposite sides of the circuit board and are brought into contact with two contact surfaces of the electrical interface, which are diametrically opposite one another at the objective lens on the outer circumference. This means that the spring contacts are also situated opposite one another at the objective lens after the contacting, so that spring forces acting upon the objective lens largely cancel each other out.

Since, in the method provided here in accordance with an example embodiment of the present invention, the mounting of the spring contacts at the circuit board and the contacting of the spring contacts with the contact surfaces formed at the objective lens take place at different times, the spring contacts must be movably mounted at the circuit board. For example, the spring contacts may be slid on and/or clamped. The mounting must take place in such a way that the spring contacts may be brought into contact with the contact surfaces formed at the objective lens at a later point in time and, in fact, after the objective lens has been fixed in position.

According to one preferred specific embodiment of the present invention, it is therefore provided that the spring contacts are held in a movable manner, in particular movable in the radial direction, for example, swivelable, at the circuit board via holding elements at least during steps b) through d). The holding elements may be fixedly connected to the spring contacts, so that the holding elements merely need to be moved in order to bring the spring contacts into contact with the contact surfaces formed at the objective lens. Advantageously, the holding elements are designed in the manner of a clamp and/or encompass the circuit board, so that the spring contacts are captively held at the circuit board. The clamp function of the holding elements also represents a secure electrical contacting of the spring contacts to the circuit board.

The spring contacts preferably each include a first end section for contacting the contact surfaces at the objective lens and a second end section for the contacting of the circuit board. The end sections may each be geometrically configured in such a way that the contact surfaces and spring forces are optimized with respect to the particular interface. In particular, the two end sections of a spring contact may be differently configured.

The holding elements for the movable mount of the spring contacts at the circuit board are preferably made of an electrically non-conductive material, so that the spring contacts are thereby electrically insulated with respect to the housing and/or other adjacent components. The clamping and/or fixing elements applied in step e) may be made of an electrically conductive material, for example, of a metal sheet, in this case. This is the case because, upon utilization of holding elements for the movable mount of the spring contacts at the circuit board, a direct contact of the clamping and/or fixing elements with the spring contacts may be avoided.

The clamping and/or fixing elements are preferably, in step e), slid between the housing and the holding elements, so that the clamping and/or fixing elements press and/or swivel the holding elements, including the spring contacts, radially inward. During this movement of the holding elements, the spring contacts are then pressed against the contact surfaces formed at the objective lens and are preferably fixed in this position. This is the case, for example, when the original movement space of the holding elements is filled by the inserted clamping and/or fixing elements.

Provided that the spring contacts are movably mounted at the circuit board without holding elements, the clamping and/or fixing elements are, in step e), slid between the housing and the spring contacts, so that the clamping and/or fixing elements press and/or swivel the spring contacts radially inward. Due to this movement, the spring contacts are pressed against the contact surfaces formed at the objective lens and are preferably fixed in this position. This is the case when the original movement space of the spring contacts is filled by the inserted clamping and/or fixing elements. Provided that no holding elements are provided, the clamping and/or fixing elements are preferably made of an electrically non-conductive material.

In one refinement of the present invention, it is provided that, in a step f), a cover part including a seal is inserted into the housing. The cover part including the seal closes the housing toward the outside, so that no dirt particles and/or no moisture enter(s) the interior of the housing. The image sensor accommodated in the housing and the electronics system accommodated in the housing are therefore optimally protected against external effects.

Advantageously, in addition, the seal is utilized for axial preloading and securing the position of the clamping and/or fixing elements and/or of the holding elements. The preload prevents the clamping and/or fixing elements from slipping out and exposing, again, the original movement space of the holding elements and/or of the spring contacts. This is the case because the spring contacts could become detached from the contact surfaces formed at the objective lens and the electrical contacting would be eliminated.

Since the method provided here allows for a low-force electrical contacting of the electrical interface of the objective lens, the advantages of the present invention come into play, in particular, in an adhesive bond between the objective lens and the housing for the reasons mentioned at the outset. Preferably, therefore, in step d), the objective lens is fixed in the housing with the aid of an adhesive bond.

Moreover, in accordance with an example embodiment of the present invention, it is provided that the adhesive bond is thermally cured, preferably until the ultimate strength has been reached. Step e) of the method according to the present invention is initiated only once the adhesive bond has reached its ultimate strength. The curing process may be accelerated by thermal curing, for example, under UV light.

In accordance with an example embodiment of the present invention, the camera module, which is also provided, includes a housing, into which a circuit board including an image sensor is inserted and fixed. Moreover, the camera module includes an objective lens including an electrical interface, which is also inserted into the housing, aligned with respect to the image sensor, and fixed in the housing. According to the present invention, clamping and/or fixing elements are situated between the housing and the circuit board, which directly or indirectly act via holding elements upon spring contacts, so that these are held, on the one hand, in contact with the circuit board and, on the other hand, in contact with the electrical interface.

With the aid of the clamping and/or fixing elements situated between the housing and the circuit board, the spring contacts may be subsequently clamped and brought into contact with the electrical interface of the objective lens. This means that the spring contacts are initially mounted in such a way that they do not rest against the objective lens and, therefore, no spring forces act upon the objective lens. The objective lens may therefore be aligned with respect to the image sensor and fixed in the housing in a largely force-free manner. Only after the fixation are the clamping and/or fixing elements slid between the housing and the circuit board and the spring contacts brought into contact with the electrical interface of the objective lens.

The camera module provided here may therefore be manufactured according to the above-described method according to the present invention. This means that the same advantages are achievable in the manufacture of the camera module provided here.

Preferably, two spring contacts are situated diametrically opposite one another at the objective lens and rest against contact surfaces formed at the objective lens on the outer circumference, which form the electrical interface of the objective lens. Due to the position of the spring contacts, their spring forces largely cancel each other out, so that the objective lens is not loaded on one side by the spring contacts.

Moreover, it is provided that the housing is closed by a cover part and a preferably annular seal is situated between the cover part and the clamping and/or fixing elements, with the aid of which the clamping and/or fixing elements are preloaded in the axial direction. The axial preload of the clamping and/or fixing elements prevents a position change, in particular a slipping out of the clamping and/or fixing elements. At the same time, the position and the preload of the spring contacts with respect to the electrical interface of the objective lens are secured in this way.

Preferably, the objective lens is connected to the housing via an adhesive bond. The adhesive bond is easily implemented and, in particular, is suitable for camera modules, which have a small overall size. In addition, the advantages of the present invention come into play, particularly clearly, in an adhesive bond. This is the case because, before the adhesive bond may be loaded, it must cure and have reached its ultimate strength. This period of time may be bridged with the aid of the subsequently inserted clamping and/or fixing elements for establishing the electrical contacting. This means that the spring contacts may be mounted, but only later brought into contact with the electrical interface of the objective lens.

One preferred specific embodiment of the present invention is explained in greater detail below with reference to the figures.

DETAILED DESCRIPTION OF EXAMPLE EMBODIMENTS

Figure 1:
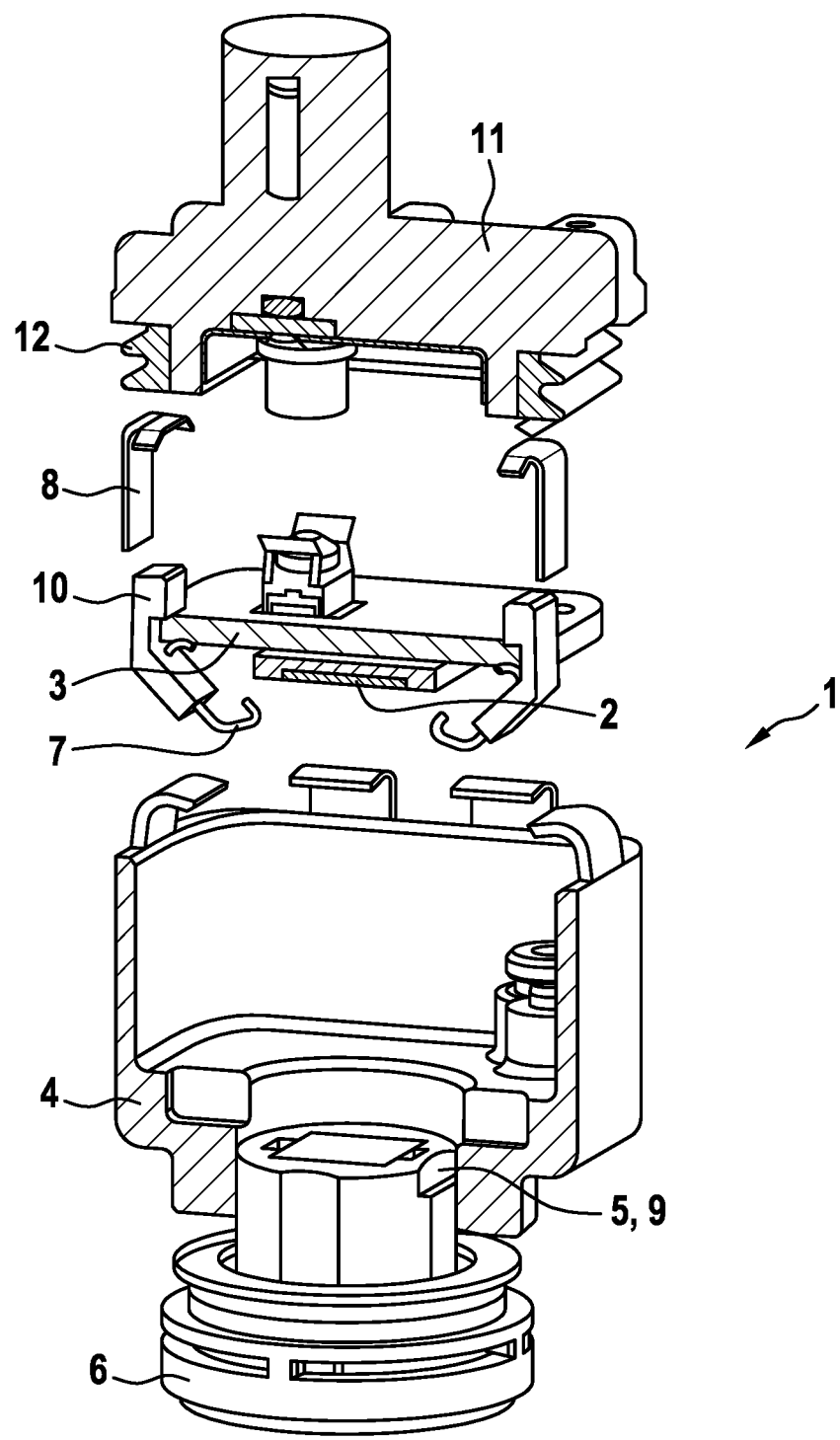
FIG. 1 shows an exploded representation of a camera module according to an example embodiment of the present invention.

Camera module 1 shown in FIG. 1 includes a circuit board 3 including an image sensor 2 and a housing 4, into which circuit board 3 is inserted. Moreover, camera module 1 includes an objective lens 6, into which an electrical consumer (not represented) is integrated, for example, a heating device. In order to supply the electrical consumer with electrical energy, objective lens 6 includes an electrical interface 5, which, in the present case, includes two contact surfaces 9, which are situated on the outer circumference and diametrically opposite one another at the objective lens 6.

After the insertion of circuit board 3 into housing 4, objective lens 6 must be inserted into housing 4 and aligned with respect to image sensor 2. Thereafter, objective lens 6 must be fixed in housing 4. The fixation may be effectuated, for example, with the aid of an adhesive bond between objective lens 6 and housing 4. Objective lens 6 should not be loaded until the adhesive bond has reached its ultimate strength, in order to secure the focal position of objective lens 6. At the same time, however, the electrical contacting of the electrical interface 5 must be implemented.

Figure 2:
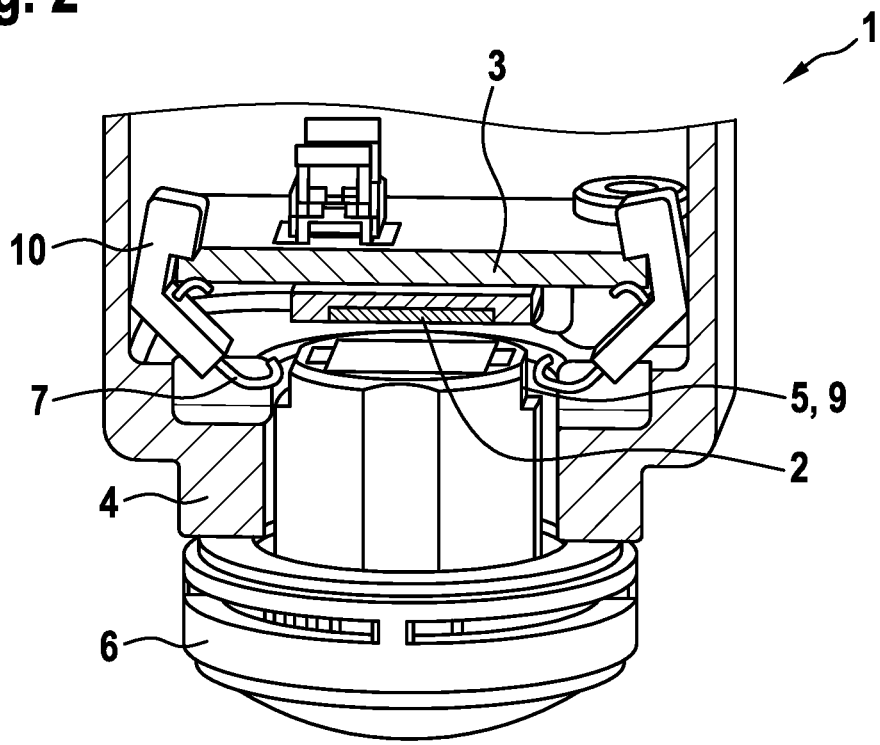
FIG. 2 shows a schematic longitudinal section through the camera module from FIG. 1 during the insertion of the circuit board into the housing.
Figure 3:
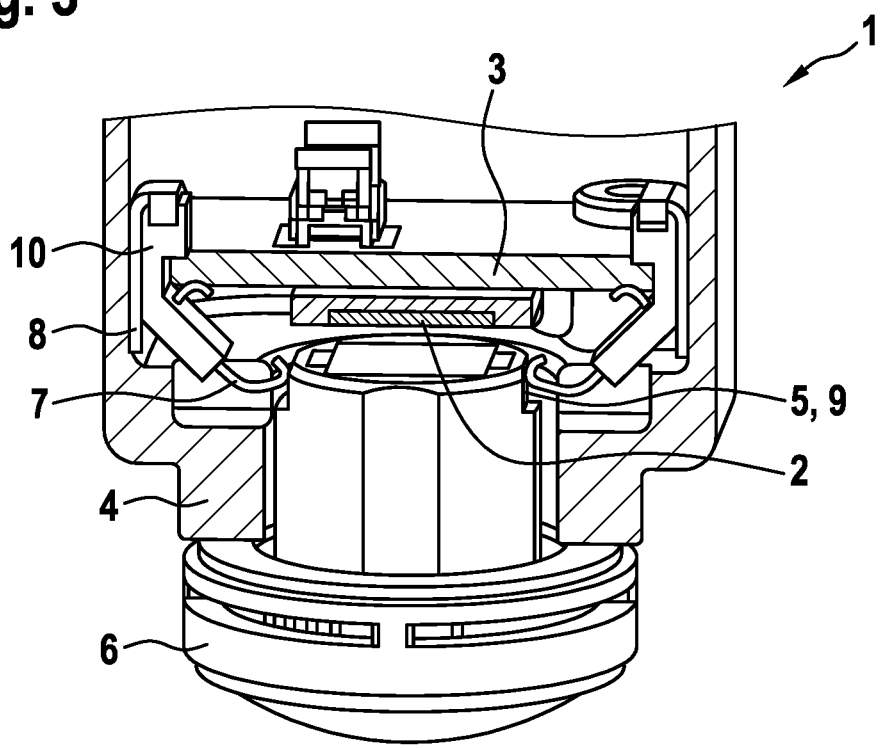
FIG. 3 shows a schematic longitudinal section through the camera module from FIG. 1 during the clamping of the spring contacts.

In represented camera module 1, the electrical contacting is therefore effectuated with the aid of two spring contacts 7, which are indirectly held via holding elements 10 in a moveable manner at circuit board 3 and are inserted, together with circuit board 3, into housing 4 (see FIG. 2). The mobility of spring contacts 7 and of holding elements 10 also continues after insertion into housing 4, since a free space remains between holding elements 10 and housing 4. This free space is utilized after the fixation of objective lens 6 in housing 4 for accommodating clamping and/or fixing elements 8, which are inserted into the free space from the outside and, thereby, press and swivel holding elements 10, including spring contacts 7, radially inward (see FIG. 3). In the process, spring contacts 7 come to rest against contact surfaces 9 of electrical interface 5 formed at objective lens 6.

Figure 4:
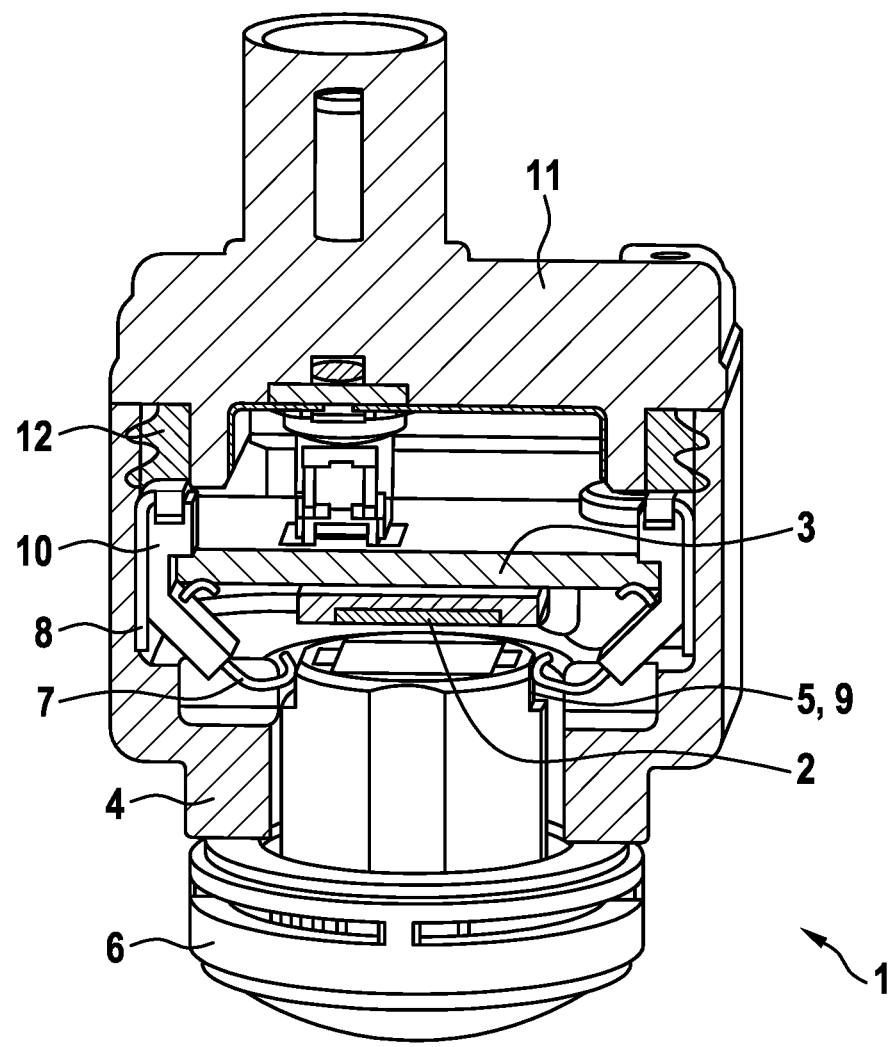
FIG. 4 shows a schematic longitudinal section through the camera module from FIG. 1 after assembly has taken place.

In a final step, housing 4 may then be closed with the aid of a cover part 11 (see FIG. 4). In the present case, cover part 11 is provided with an annular seal 12, which rests against housing 4 with a radial preload after the installation of cover part 11. Seal 12 rests against clamping and/or fixing elements 8, also under an axial preload, so that these are permanently held in position. The same also applies for holding elements 10 and spring contacts 7.

What is claimed is:

1. A method for manufacturing a camera module, the method comprising:
   a) mounting an image sensor on a circuit board;
   b) inserting and fixing the circuit board into a housing, wherein spring contacts, which are movable with respect to the circuit board, are inserted into the housing together with the circuit board;
   c) aligning an objective lens accommodated in the housing and including an electrical interface with respect to the image sensor;
   d) fixing the objective lens in the housing; and
   e) bringing, after the fixation of the objective lens in the housing, the spring contacts into contact with the electrical interface using clamping and/or fixing elements;
   wherein the spring contacts are held in a movable manner, movable in a radial direction, at the circuit board via holding elements at least during steps b) through d), and
   wherein a free space between the holding elements and the housing is used after the fixing of the objective lens in the housing for accommodating the clamping elements and/or fixing elements, which are inserted into the free space from the outside, so as to press and swivel the holding elements, including the spring contacts, radially inward, so that the spring contacts rest against contact surfaces of the electrical interface formed at the objective lens.

2. The method as recited in claim 1, wherein the spring contacts are situated at opposite sides of the circuit board relative to one another and are brought into contact with two contact surfaces of the electrical interface, which are diametrically opposite one another at the objective lens on the outer circumference.

3. The method as recited in claim 1, wherein in a step further comprising:
   f) inserting a cover part, including a seal, into the housing, the seal being utilized for axially preloading and securing the position of the clamping elements, and/or fixing elements, and/or the holding elements.

4. The method as recited in claim 1, wherein in step d) the objective lens is fixed in the housing using an adhesive bond.

5. The method as recited in claim 4, wherein the adhesive bond is thermally cured.

6. A camera module, comprising:
a housing, wherein a circuit board, including an image sensor, which is inserted into and fixed in the housing;
an objective lens including an electrical interface, which is also inserted into the housing, aligned with respect to the image sensor, and fixed in the housing; and
clamping and/or fixing elements, which are situated between the housing and the circuit board, which act via holding elements upon spring contacts, so that the spring contacts are held in contact with the circuit board and in contact with the electrical interface;
wherein the spring contacts are held in a movable manner, movable in a radial direction, at the circuit board via the holding elements, and
wherein a free space between the holding elements and the housing is used after the fixing of the objective lens in the housing for accommodating the clamping elements and/or fixing elements, which are inserted into the free space from the outside, so as to press and swivel the holding elements, including the spring contacts, radially inward, so that the spring contacts rest against contact surfaces of the electrical interface formed at the objective lens.

7. The camera module as recited in claim 6, wherein the spring contacts are situated diametrically opposite one another at the objective lens and rest against contact surfaces formed at the objective lens on an outer circumference, which form the electrical interface of the objective lens.

8. The camera module as recited in claim 6, wherein the housing is closed by a cover part and an annular seal is situated between the cover part and the clamping and/or fixing elements, by which the clamping and/or fixing elements are preloaded in an axial direction.

9. The camera module as recited in claim 6, wherein the objective lens is connected to the housing via an adhesive bond.

* * * * *